United States Patent
Noda

(10) Patent No.: US 8,422,222 B2
(45) Date of Patent: Apr. 16, 2013

(54) POWER CONVERSION APPARATUS

(75) Inventor: Satoshi Noda, Kariya (JP)

(73) Assignee: Denso Corporation, Kariya (JP)

(*) Notice: Subject to any disclaimer, the term of this patent is extended or adjusted under 35 U.S.C. 154(b) by 197 days.

(21) Appl. No.: 13/006,066

(22) Filed: Jan. 13, 2011

(65) Prior Publication Data

US 2011/0280056 A1    Nov. 17, 2011

(30) Foreign Application Priority Data

Jan. 14, 2010  (JP) ................. 2010-005611
Dec. 21, 2010  (JP) ................. 2010-284740

(51) Int. Cl.
   *H05K 7/20*    (2006.01)
(52) U.S. Cl.
   USPC ............................. 361/689; 361/811; 439/709
(58) Field of Classification Search .............. 361/689, 361/811; 439/709
   See application file for complete search history.

(56) References Cited

U.S. PATENT DOCUMENTS

| | | | |
|---|---|---|---|
| 7,978,471 B2 * | 7/2011 | Tokuyama et al. | ........... 361/699 |
| 2003/0057705 A1 | 3/2003 | Kusumi et al. | |
| 2003/0151893 A1 * | 8/2003 | Meyer et al. | ................... 361/688 |
| 2008/0130223 A1 * | 6/2008 | Nakamura et al. | ............ 361/689 |
| 2012/0170217 A1 * | 7/2012 | Nishikimi et al. | ............ 361/689 |

FOREIGN PATENT DOCUMENTS

| JP | 2003-009301 | 1/2003 |
|---|---|---|
| JP | 2003-189403 | 7/2003 |
| JP | 2007-050887 | 3/2007 |
| JP | 2009-081993 | 4/2009 |

* cited by examiner

*Primary Examiner* — Hien Vu
(74) *Attorney, Agent, or Firm* — Nixon & Vanderhye P.C.

(57) ABSTRACT

A power conversion apparatus is provided, which accommodates electronic components configuring at least part of a power conversion circuit, and a terminal block collecting wires running from the electronic components, in a case. The terminal block includes a plurality of terminal connecting parts at which a plurality of high-voltage cables, through which electric power is received from and provided to the outside of the case, and the wires are connected to each other, and insulating parts provided between the terminal connecting parts and ensuring insulation between the high-voltage cables and between the wires. A plurality of insertion holes, into which the high-voltage cables are inserted, are formed in one side wall of the case. An opening part for performing an operation for fixing the high-voltage cables to the terminal connecting parts is formed in a wall of the case opposed to the terminal connecting parts and the insulating parts. An extending part is formed around the opening part so as to extend from a circumference of the opening part toward the terminal block side.

7 Claims, 12 Drawing Sheets

POWER CONVERSION APPARATUS

CROSS-REFERENCE TO RELATED APPLICATION

This application is based on and claims the benefit of priority from earlier Japanese Patent Applications No. 2010-5611 filed on Jan. 14, 2010, and No. 2010-284740 filed on Dec. 21, 2010, the descriptions of which are incorporated herein by reference.

BACKGROUND

1. Technical Field

The present invention relates to a power conversion apparatus such as an inverter which is installed in a passenger car, an auto truck or the like.

2. Related Art

A large-capacity inverter, which converts DC power to AC power or AC power to DC power, is required for a hybrid vehicle having both an internal-combustion engine and an electric motor as driving sources, an automobile including an electric motor as a driving source, and the like. Hence, various power conversion apparatuses including an inverter have been developed.

As an example, power conversion apparatuses are known which are disclosed in JP-A-2009-81993 and JP-A-2007-50887. As shown in FIG. 17, a power conversion apparatus 100 is configured by accommodating electronic components including an inverter, and a resin terminal block 102 collecting wires 101 running from the electronic components, in a case 103.

A plurality of through-holes 103a, into which a high-voltage cable 104 is inserted, are formed in one side wall configuring the metal case 103. The high-voltage cable 104 inserted and arranged in the through-hole 103a is fastened to the terminal block 102 together with the wire 101 by using a bolt 106. Hence, electric power can be received to the inside of the case 103 and provided to the outside of the case 103 via the wire 101 and high-voltage cable 104.

In addition, an opening part 105 for inserting the bolt 106 is formed in the case 103. The bolt 106 and a tool such as a screwdriver are inserted from above through the opening part 105 to fasten the high-voltage cable 104 and the wire 101 to the terminal block 102 by using the bolt 106. In addition, a cover 107 is arranged above the opening part 105 to ensure the waterproof property of the case 103. The cover 107 can close the opening part 105 after the high-voltage cable 104 and the wire 101 are fastened to the terminal block 102 by the bolt 106.

In the above-described power conversion apparatus 100, the case 103 and a terminal 104a of an end portion of the high-voltage cable 104 connected to the wire 101 are made of conductors. The case 103 and the terminal 104a are required to have electric potentials different from each other for normal operation. Hence, an insulation distance is required to be ensured between the terminal 104a and a side wall of the case 103. Meanwhile, when the terminal block 102, on which the terminal 104a is mounted for ensuring an insulation distance, is arranged in a state where the terminal block 102 is separated from the case 103, a gap is generated between the terminal block 102 and the case 103. As a result, in a process of fastening the bolt 106, the bolt 106 can be detached from the tool and fall into the case 103 through the gap.

To solve the above problem, in the conventional art, while the terminal 104a is arranged being separated from the case 103, the terminal block 102 is extended from the connection portion between the terminal 104a and the wire 101 toward the case 103 side so as to be close to the side wall of the case 103, so that the bolt 106 does not fall through the gap. Thereby, the bolt 106 is prevented from falling into the back of the case 103 while ensuring an insulation distance.

However, when the terminal block 102 is extended from the connection portion between the terminal 104a and the wire 101 toward the case 103 side, the terminal 104a and the side wall of the case 103 are separated from each other. Hence, to easily retrieve the bolt 106 fallen on the terminal block 102, the area of the opening part 105 is required be made large. However, when the area of the opening part 105 is large, the load applied to the cover 107 becomes large due to the differential pressure between the inside and the outside of the case 103, whereby the sealing property between the case 103 and the cover 107 is lowered. Hence, the number of places where the bolts 106 are fastened is required to be increased to increase the sticking intensity of the cover 107. Conversely, when the area of the opening part 105 is made small, the bolt 106 fallen on the terminal block 102 cannot be seen through the opening part 105, whereby retrieving the bolt 106 can become difficult.

SUMMARY

An embodiment provides a power conversion apparatus which prevents a bolt from falling into the back of a case and allows a bolt fallen on a terminal block to be easily retrieved regardless of the size of an opening part.

As an aspect of the embodiment, in a power conversion apparatus, which accommodates electronic components configuring at least part of a power conversion circuit, and a terminal block collecting wires running from the electronic components, in a case, the terminal block includes a plurality of terminal connecting parts at which a plurality of high-voltage cables, through which electric power is received from and provided to the outside of the case, and the wires are connected to each other, and insulating parts provided between the terminal connecting parts and ensuring insulation between the high-voltage cables and between the wires, a plurality of insertion holes, into which the high-voltage cables are inserted, are formed in one side wall of the case, an opening part for performing an operation for fixing the high-voltage cables to the terminal connecting parts is formed in a wall of the case opposed to the terminal connecting parts and the insulating parts, and an extending part is formed around the opening part so as to extend from a circumference of the opening part toward the terminal block side.

DETAILED DESCRIPTION OF THE PREFERRED EMBODIMENTS

With reference to the accompanying drawings, hereinafter are described embodiments. Throughout the drawings, components identical with or similar to each other are given the same numerals for the sake of omitting unnecessary explanation.

(First Embodiment)

Hereinafter, a power conversion apparatus according to a first embodiment will be explained with reference to FIGS. 1 to 8.

Figure 1:
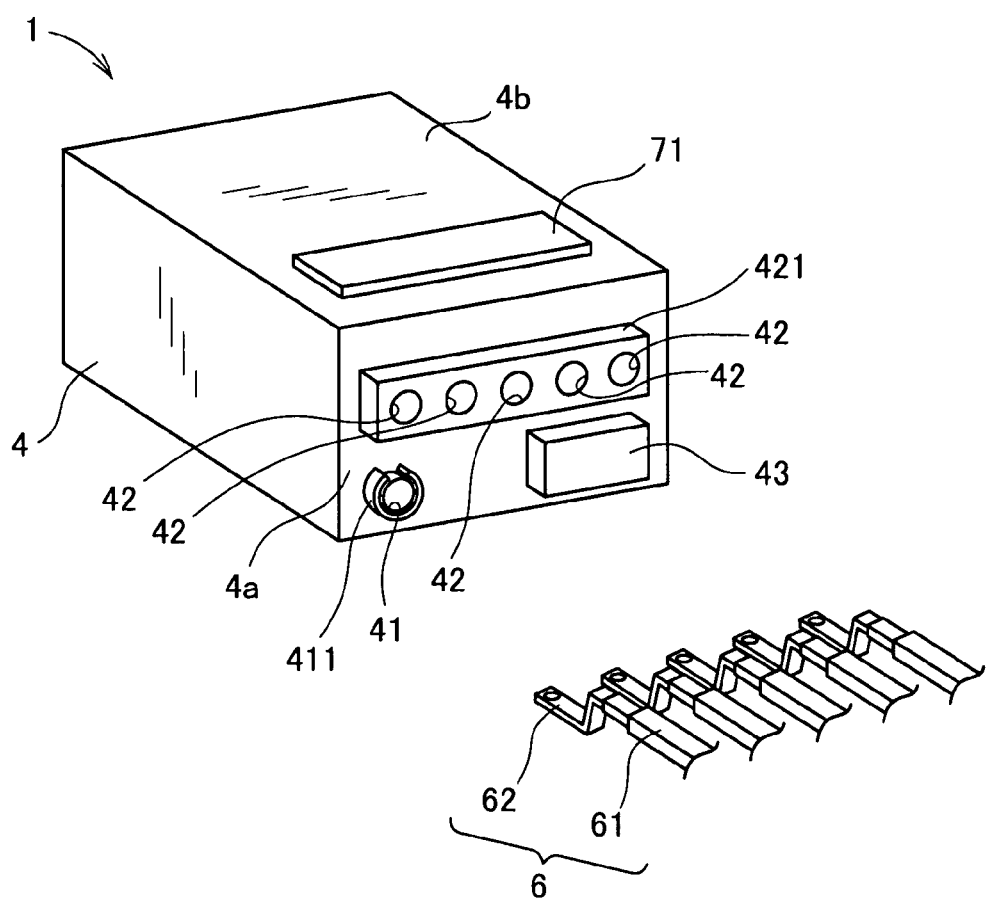
FIG. 1 is a perspective view showing a power conversion apparatus.
Figure 2:
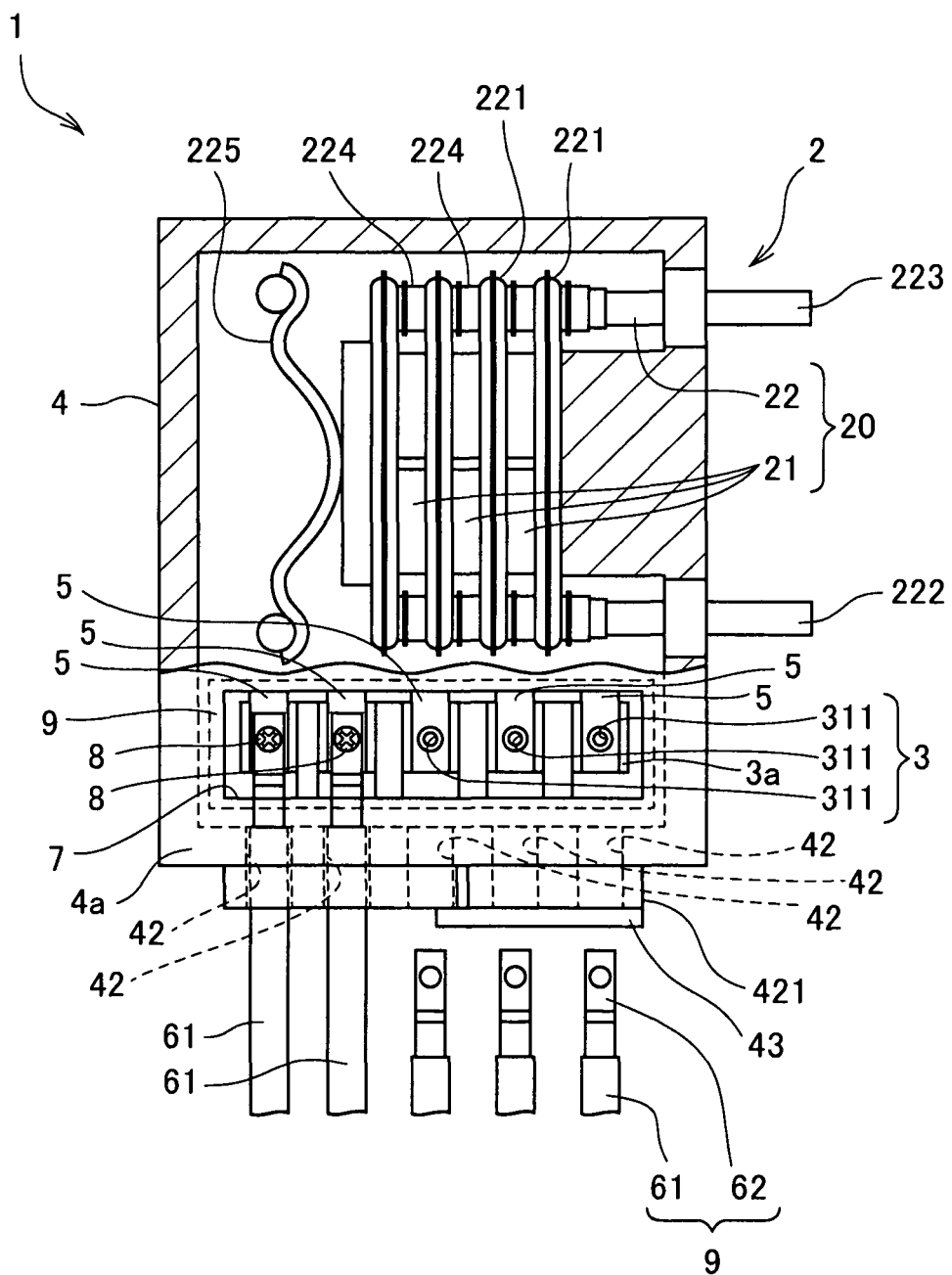
FIG. 2 is a plan view showing the power conversion apparatus.

As shown in FIGS. 1 and 2, a power conversion apparatus 1 of the present embodiment is configured by accommodating electronic components 2, and a terminal block 3 collecting bus bars 5 which are wires running from the electronic components 2, in a case 4.

The electronic components 2 accommodated in the case 4 includes, as shown in FIG. 2, a semiconductor stacked unit 20 consisting of semiconductor modules 21, which configure part of a power conversion circuit, and a cooler 22 cooling the semiconductor modules 21. As the electronic components 2, a control circuit board (not shown) and a capacitor (not shown) are also accommodated. The control circuit board is connected to the semiconductor modules 21 and controls the semiconductor modules 21. The capacitor restrains pulsating voltages.

The cooler 22, which cools the semiconductor modules 21, includes a plurality of cooling tubes 221 which are in contact with the main surfaces of the semiconductor modules 21 and hold the semiconductor modules 21 therebetween. The cooling tubes 221 have a flat quadrangular shape and are stacked with a predetermined distance therebetween. In addition, connecting parts 224 connecting the cooling tubes 221 to each other are formed at the both ends in the longitudinal direction of the stacked plurality of cooling tubes 221. Cooling water flows in the cooling tubes 221 and the connecting parts 224. In addition, a supply tube 222 and a discharge tube 223 are respectively connected to the ends in the stacked direction of the cooling tubes 221 and both ends in the longitudinal direction of the cooling tubes 221. The supply tube 222 supplied cooling water from the outside of the case 4 to the cooling tubes 221. The discharge tube 223 discharges the cooling water from the cooling tubes 221. The supply tube 222 and the discharge tube 223 have a cylindrical shape and are accommodated in the case 4 in a state where the ends thereof project to the outside of the case 4.

The semiconductor modules 21 are configured with one type or plural types of semiconductor elements and are configured by molding the semiconductor elements. In addition, to make the staked semiconductor modules 21 bring into close contact with the cooling tubes 221, a plate spring 225 is arranged between the case 4 and the ends in the stacked direction of the cooling tubes 221 so as to bias the cooling tubes 221 toward the supply tube 222 and the discharge tube 223 side.

Figure 3:
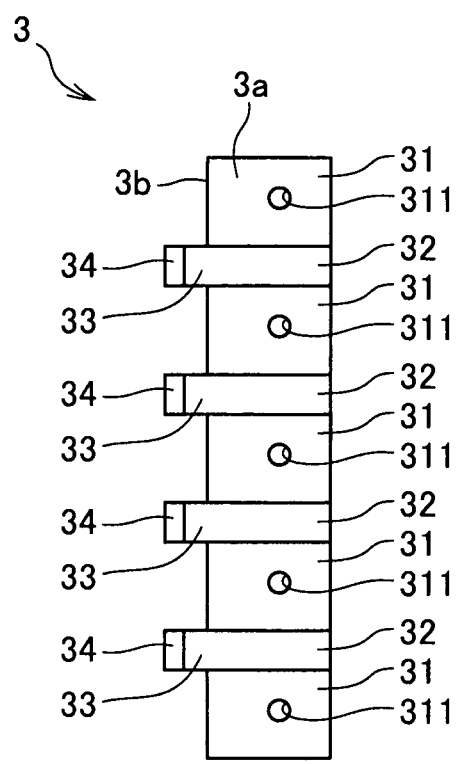
FIG. 3 is a plan view showing a terminal block.

The terminal block 3 is arranged so as to be adjacent to the semiconductor stacked unit 20, and is formed into a rectangular shape by using insulating resin. Connecting parts between the bus bars 5 and high-voltage cables 6 are mounted on a mounting surface 3a of the terminal block 3. The bus bars 5 are wires running from the electronic components 2. The high-voltage cables 6 run from an external power source, motor and the like, which are not shown. As shown in FIG. 3, the mounting surface 3a of the terminal block 3 is configured by alternately forming terminal connecting parts 31 and insulating parts 32. That is, a plurality of terminal connecting parts 31, which are portions at which the high-voltage cables 6 and the bus bars 5 are connected to each other, are formed with a predetermined distance therebetween. The insulating parts 32, which are portions ensuring the insulation between the high-voltage cables 6 adjacent to each other and between the bus bars 5 adjacent to each other, are formed between the terminal connecting parts 31 adjacent to each other. In the present embodiment, five terminal connecting parts 31 are formed. One insulating part 32 is formed between the terminal connecting parts 31 adjacent to each other. That is, four insulating parts 32 are formed in total.

Fastening holes 311 for fastening the bolt 8, which have a screw thread, are provided in the terminal connecting parts 31 of the terminal block 3. The bus bars 5 extending from the electronic components 2 side are arranged on the five terminal connecting parts 31. In addition, the high-voltage cables 6 are arranged on the terminal connecting parts 31. The high-voltage cables 6 extend from the side of the side wall of the case 4, that is, the side opposed to the electronic components 2 (semiconductor stacked unit 20) with respect to the terminal block 3.

Figure 4:
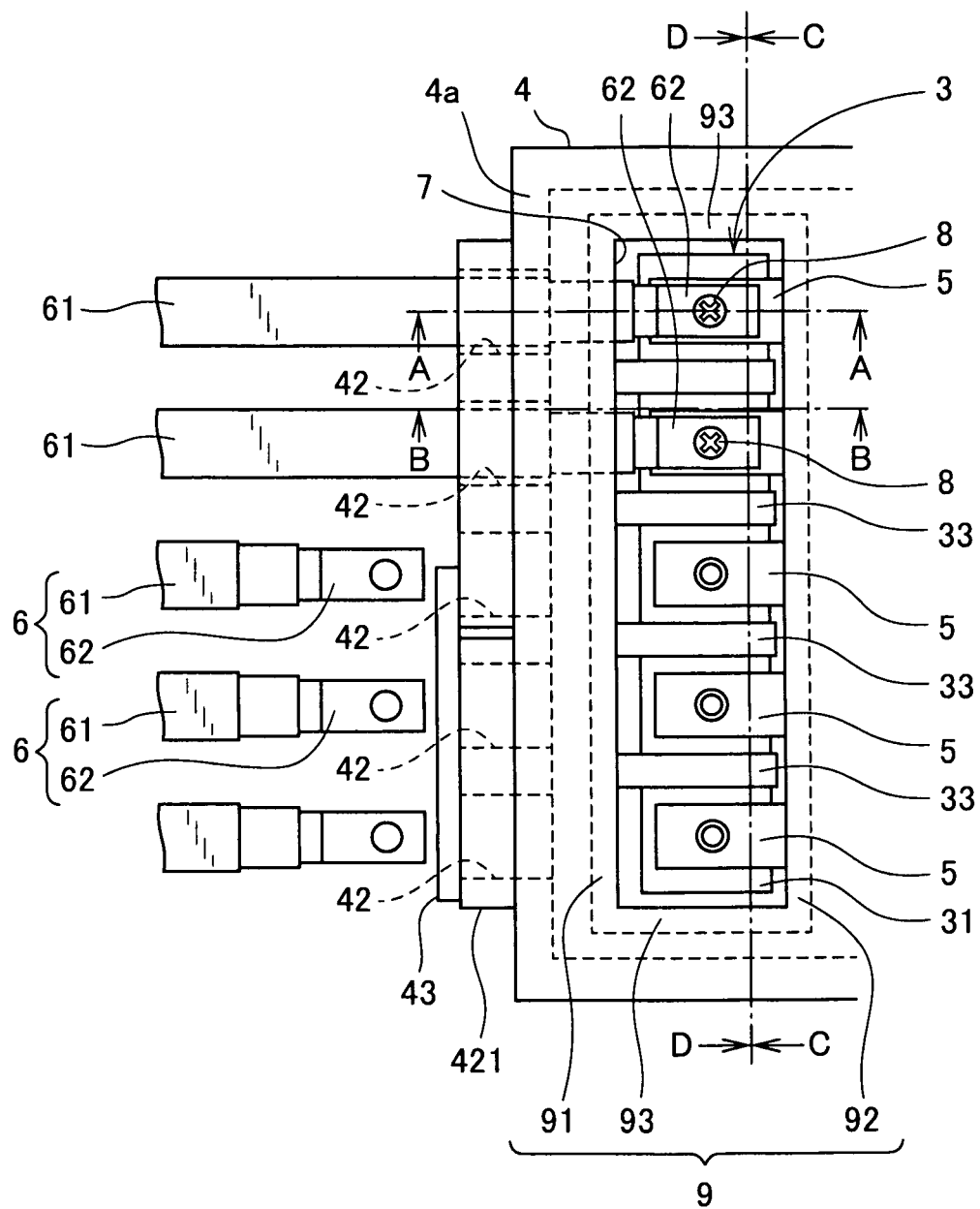
FIG. 4 is an enlarged plan view of the power conversion apparatus.
Figure 5:
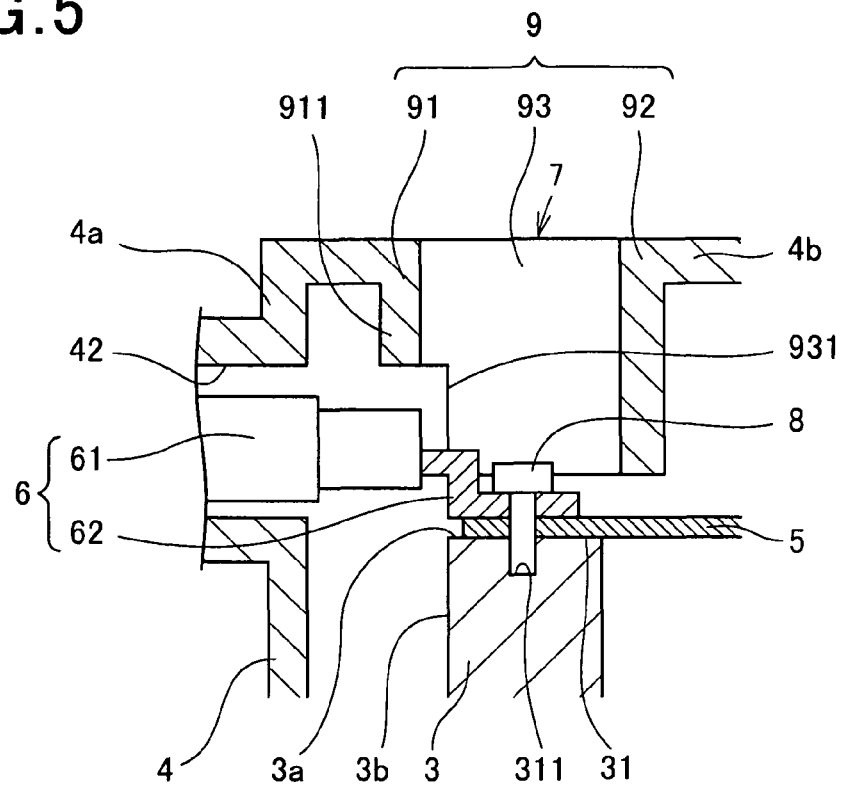
FIG. 5 is a sectional view cut along A-A line of FIG. 4.

As shown in FIGS. 4 and 5, the high-voltage cable 6 includes a wire part 61, in which a conducting wire is covered with an insulating sheath, and a terminal part 62, which is provided on the end of the wire part 61. In addition, in a state where the terminal part 62 of the high-voltage cable 6 overlaps the bus bar 5, the terminal part 62 and the bus bar 5 are fastened together with each other to the terminal connecting part 31 of the terminal block 3 by using the bolt 8. Electric power can be received and provided via the bus bars 5 and the high-voltage cable 6 connected at the terminal connecting parts 31 of the terminal block 3.

The case 4 accommodating the electronic components 2 and the terminal block 3 is a box having an internal space, and is formed by die-casting a metal such as aluminum. As shown in FIGS. 1 and 2, a ventilation hole 41, insertion holes 42, and an input connector 43 are provided in/on the side wall 42a of the side walls of the case 4 on the side where the terminal block 3 is arranged. In addition, an opening part 7 is formed in the case side wall 4b which is orthogonal to the side wall 4a and is opposed to the mounting surface 3a of the terminal block 3 on which the terminal connecting parts 31 and the insulating parts 32 are formed. In addition, a cover 71 (refer to FIG. 1) is arranged above the opening part 7 and is fixed to the case 4 by screws, which are not shown.

The ventilation hole 41 is formed so as to penetrate through the side wall 4a to balance the pressure difference between the inside and the outside of the case 4. In addition, a water-proof wall 411, which projects from the side wall 4a to the outside of the case 4, is formed around the ventilation hole 41 to make the ventilation hole 41 waterproof.

The insertion holes 42 are formed so as to penetrate through the side wall 4a. The high-voltage cables 6 are inserted into the insertion holes 42. The terminal parts 62 of the high-voltage cables 6 are arranged on the terminal block 3 in the case 4. In addition, a projecting wall 421 is formed around the insertion holes 42. The projecting wall 421 projects from the side wall 4a to the outside of the case 4. Inner periphery surfaces of the projecting wall 421 are in close contact with O-rings, which are not shown, provided around the wire parts 61 of the high-voltage cables 6, thereby sealing the insertion holes 42.

The input connector 43 inputs signals from ECUs and sensors, which are not shown, into the electronic components 2.

Hereinafter, characteristic structures of the present embodiment will be explained.

As shown in FIG. 4, the opening part 7 has a rectangular shape and has an area in a planar view slightly larger than that of the terminal block 3. As shown in FIGS. 5 to 8, a plate-shaped extending part 9 is formed around the opening part 7. The extending part 9 extends from the whole circumference of the opening part 7 toward the terminal block 3.

The extending part 9 is formed with a hole-side extending part 91 (refer to FIG. 5), a counter-hole-side extending part 92 (refer to FIG. 6), and an intermediate extending parts 93 (refer to FIGS. 5 and 6) and around the whole circumference of the opening part 7. The hole-side extending part 91 extends from the border portion of the opening part 7 positioned on the insertion holes 42 side. The counter-hole-side extending part 92 is opposed to the hole-side extending part 91 on the side opposed to the insertion holes 42. The intermediate extending part 93 is interposed between the hole-side extending part 91 and the counter-hole-side extending part 92. In addition, as shown in FIG. 7, the hole-side extending part 91 includes first extending parts 911, which are opposed to the terminal connecting parts 31 of the terminal block 3, and second extending parts 912, which are opposed to the insulating parts 32 of the terminal block 3. In the present embodiment, since the first extending parts 911 are respectively opposed to the terminal connecting parts 31, and the second extending parts 912 are respectively opposed to the insulating parts 32, five first extending parts 911 and four second extending parts 912 are formed.

FIG. 5 is a sectional view cut along A-A line of FIG. 4. FIG. 7 is a sectional view cut along C-C line of FIG. 4. The high-voltage cables 6 are arranged at the terminal connecting parts 31. Hence, the length of the first extending part 911 which projects opposing to the terminal connecting part 31 is determined so that the first extending part 911 does not reach the projection domain of the insertion hole 42, which prevents the high-voltage cable 6 from contacting the first extending part 911 when the high-voltage cable 6 is inserted. That is, the end of the first extending part 911 is positioned so as to be closer to the opening part 7 side than to the end portion of the insertion hole 42 on the opening part 7 side. In addition, the first extending part 911 is formed so that the end of the first extending part 911 and the high-voltage cable 6 are separated from each other at a predetermined distance to ensure an insulation distance therebetween. Meanwhile, the first extending part 911 is formed so that the gap between the end of the first extending part 911 and the high-voltage cable 6 has a distance (e.g. a distance smaller than the diameter of the head of the bolt 8) which prevents the bolt 8 from passing through the gap.

Figure 6:
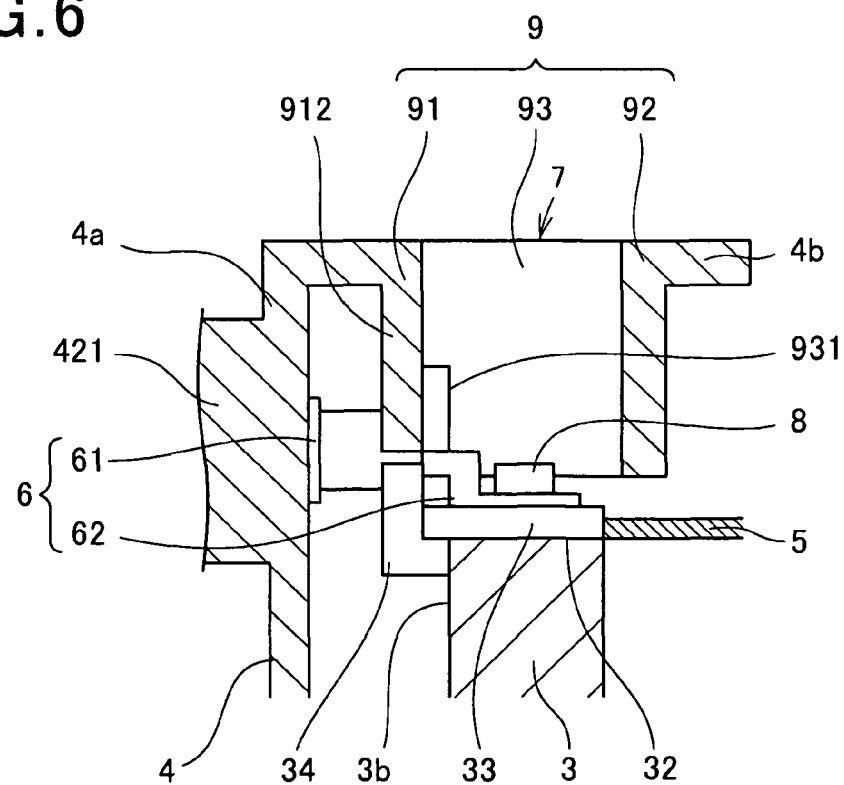
FIG. 6 is a sectional view cut along B-B line of FIG. 4.
Figure 7:
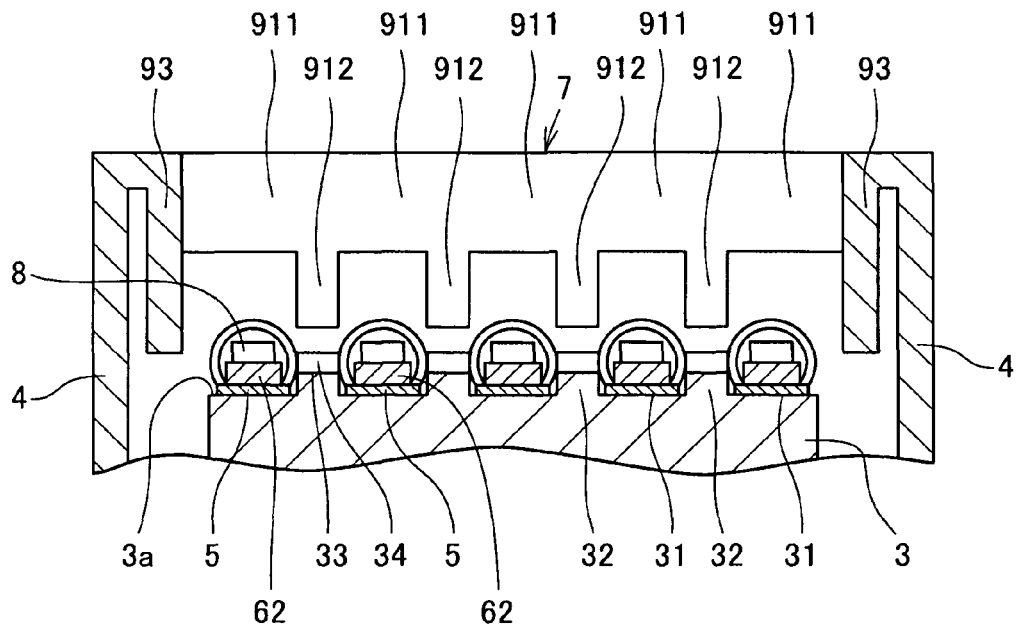
FIG. 7 is a sectional view cut along C-C line of FIG. 4.

FIG. 6 is a sectional view cut along B-B line of FIG. 4. The insulating part 32 differs from the terminal connecting part 31 in that the high-voltage cable 6 is not arranged at the insulating part 32. Hence, if the second extending part 912 opposed to the insulating part 32 is formed so as to have the same length as that of the first extending part 911, a space corresponding to the diameter of the high-voltage cable 6 is generated between the end of the second extending part 912 and the insulating part 32. To solve this problem, the second extending part 912 opposed to the insulating part 32 is formed so as to extend further toward the terminal block 3 side than the first extending part 911 opposed to the terminal connecting part 31 extends toward the terminal block 3 side. Hence, the space generated between the end of the second extending part 912 and the insulating part 32 is made small.

As described above, the hole-side extending part 91 is configured by alternately arranging the first extending parts 911 respectively opposed to the terminal connecting parts 31 and the second extending parts 912 respectively opposed to the insulating part 32, thereby forming a comb-like shape.

Figure 8:
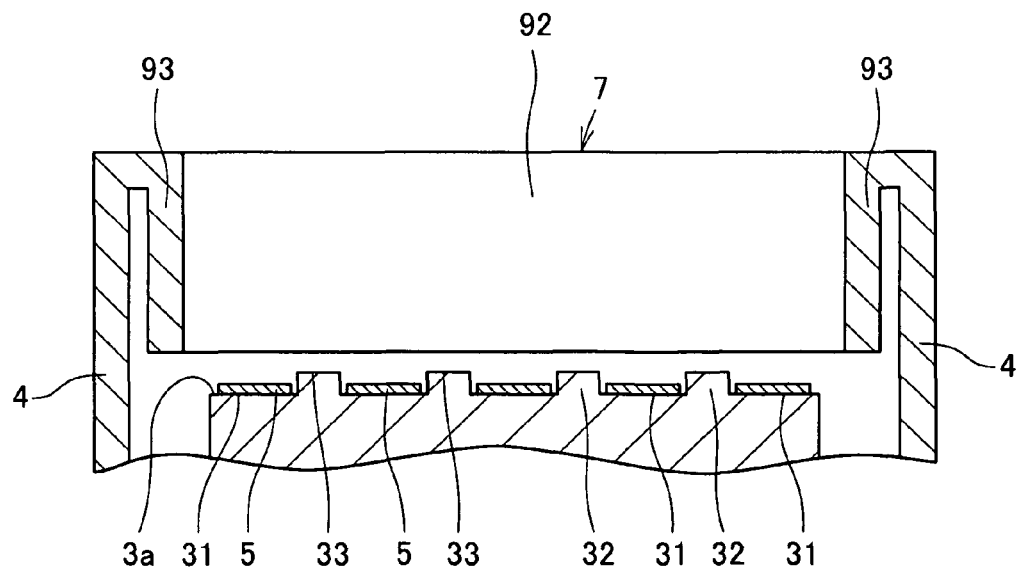
FIG. 8 is a sectional view cut along D-D line of FIG. 4.

FIG. 8 is a sectional view cut along D-D line of FIG. 4. As shown in FIG. 8, the counter-hole-side extending part 92 is formed in the direction in which the bus bars 5 are arranged, while the counter-hole-side extending part 92 is separated from the bus bars 5 at a predetermined distance to ensure an insulation distance therebetween. That is, the counter-hole-side extending part 92 differs from the hole-side extending part 91 in that the counter-hole-side extending part 92 is linearly shaped while keeping the distance between the counter-hole-side extending part 92 and the bus bars 5 constant.

In addition, the counter-hole-side extending part 92 is formed so that the gap between the end of the counter-hole-side extending part 92 and the bus bar 5 has a distance (e.g. a distance smaller than the diameter of the head of the bolt 8) which prevents the bolt 8 rolling on the mounting surface 3a from passing through the gap.

Two intermediate extending parts 93 interposed between the hole-side extending part 91 and the counter-hole-side extending part 92 is, as shown in FIG. 5, formed so as to mostly have the same length as that of the counter-hole-side extending part 92. A step part 931 is formed on the insertion holes 42 side of the intermediate extending part 93. A portion of the intermediate extending part 93 on the insertion holes 42 side is formed so as to have the same length as that of the first extending part 911.

As shown in FIG. 3, convex guides 33 are respectively formed on the insulating parts 32 of the terminal block 3 in the direction in which the high-voltage cables 6 are inserted, that is, the direction in which the bus bars 5 extend. As shown in FIGS. 5 and 6, the height of the guide 33 is more than the thickness of the bus bar 5 and less than the sum of the thickness of the bus bar 5 and the thickness of the terminal part 62 of the high-voltage cable 6. In addition, the guide 33 is formed so that the end in the extending direction thereof projects toward the insertion hole 42 side.

A projection part 34 projecting toward the second extending part 912 side is formed integrally with the end on the insertion hole 42 side of the insulating part 32. A portion of the guide 33 facing the insulating part 32 is formed so as to partially project from a side surface 3b on the insertion hole 42 side of the terminal block 3, the side surface 3b being orthogonal to the mounting surface 3a. The projection part 34 is formed on the projecting portion. In other words, the projection part 34 having an L-shaped cross section is formed on the side surface 3b on the insertion hole 42 side of the terminal block 3. One end of the projection part 34 is joined to the side surface 3b on the insertion hole 42 side. The other end of the projection part 34 is formed so as to bend toward the second extending parts 912 side. The projection part 34 and the second extending part 912 are formed so that surfaces thereof on the side opposed to the insertion hole 42 are flush with each other. The projection part 34 and the second extending part 912 are formed so that the distance of the gap between the ends thereof is smaller than the diameter of the head of the bolt 8. In addition, the projection part 34 and the guide 33 are formed so as to be integrally connected to each other.

A process of operation for connecting the high-voltage cable 6 to the power conversion apparatus 1 described above will be explained.

To begin with, in a step before the high-voltage cable 6 is connected, the cover 71 is not arranged above the opening part 7 of the case 4. Meanwhile, the electronic components 2 and the terminal block 3 are arranged in the case 4, and the case 4 is sealed.

The power conversion apparatus 1 described above is placed on a workbench in a state where the opening part 7 is in an upward direction. In this state, the high-voltage cable 6 is inserted into the insertion hole 42, and the terminal part 62 of the high-voltage cable 6 is overlaid on the bus bar 5. Then, the bolt 8 is inserted into the opening part 7 from above together with a tool to screw the bolt 8 into the fastening hole 311 of the terminal connecting part 31 of the terminal block 3. As a result, the terminal part 62 and the bus bar 5 are fastened together with each other to the terminal connecting part 31 of the terminal block 3.

In this case, due to an error by an operator, the bolt 8 can be detached from the tool during the time between inserting the bolt 8 into the opening part 7 and screwing the bolt 8 into the fastening hole 311. Even in such a case, the extending part 9 is formed which extends from the circumference of the opening part 7 toward the terminal block 3 side, and the projection parts 34 are formed which extends from the terminal block 3. Hence, the bolt 8 hits against the extending part 9 and the projection part 34, and is prevented from entering the inside of the case 4 over the extending part 9 and the projection part 34. In addition, the gap between the first extending part 911 and the high-voltage cable 6 and the gap between the counter-hole-side extending part 92 and the bus bar 5 are made small. In addition, the projection part 34 is formed, which extends from the terminal block 3 side, at the end portion of the insulating part 32 of the terminal block 3. Hence, even if the bolt 8 detached from a tool falls to the mounting surface 3a of the terminal block 3 and rolls to the circumference of the terminal block 3, the rolling bolt 8 is prevented from entering the back of the case 4 by the first extending part 911 (hole-side extending part 91), the counter-hole-side extending part 92, and the projection part 34. In addition, since the convex guides 33 are respectively formed on the insulating parts 32, the bolt 8 fallen during operations at the terminal connecting parts 31 is prevented from rolling far.

Then, after the terminal part 62 and the bus bar 5 are fastened together with each other to the terminal connecting part 31 of the terminal block 3, the cover 71 is arranged above the opening part 7. Thereafter, the cover 71 is fixed to the case 4 by a plurality of screws, which are not shown, thereby completing the operation of connecting the high-voltage cables 6.

Next, advantages of the present embodiment will be explained.

According to the above configuration, the extending part 9 is formed which extends from the circumference of the opening part 7, which has an area in a planar view slightly larger than that of the terminal block 3, toward the terminal block 3 side. The gaps between the ends of the extending part 9 and the high-voltage cables 6 and between the ends of the extending part 9 and the terminal block 3 have distances which prevent the bolt 8 from falling through the gaps. Hence, if the bolt 8 is accidentally detached from a tool when attaching the high-voltage cable 6, the bolt 8 is prevented from falling from the terminal block 3 to the back of the case 4 by the extending part 9. Hence, even if a gap is generated between the terminal block 3 and the side wall 4a of the case when using the small terminal block 3 without filling the gap between the terminal block and the side wall of the case by using a large-size terminal block as in the case of a conventional structure, the bolt 8 is prevented from falling to the back of the case 4. In addition, even if the bolt 8 falls to the mounting surface 3a, the bolt 8 remains on the terminal block 3 due to the extending part 9. Hence, the fallen bolt 8 can be seen even through the opening part 7 smaller than those of conventional structures. As a result, the fallen bolt 8 can be easily retrieved.

In addition, the second extending parts 912 opposed to the insulating parts 32 are formed so as to extend toward the terminal block 3 side. The second extending parts 912 are closer to the terminal block 3 than the first extending parts 911 opposed to the terminal connecting parts 31 are to the terminal block 3. The high-voltage cables 6 are not arranged on the insulating parts 32. Hence, if the second extending part 912 is formed so as to have the same length as that of the first extending part 911, a space corresponding to the diameter of the high-voltage cable 6 is generated between the insulating part 32 and the second extending part 912. The bolt 8 falls into the back of the case 4 through the space. Conversely, according to the configuration described above, the second extending parts 912 are formed so as to extend further toward the terminal 3 than the first extending parts 911 extend toward the terminal 3. Hence, the space between the insulating part 32 and the second extending part 912 can be made small, which can prevent the bolt 8 from falling into the back of the case 4 from the insulating part 32.

In addition, the projection part 34 is provided on the end portion of the insulating part 32, which is positioned on the insertion hole 42 side, of the terminal block 3. As described above, since the high-voltage cable 6 is not arranged on the insulating part 32, a space is generated between the terminal block 3 and the hole-side extending part 91. By filling the space with the projection part 34 extending toward the hole-side extending part 91, the bolt 8 is prevented from falling through the gap between the terminal block 3 and the hole-side extending part 91. In addition, the portion of the projection part 34 overlapping with the hole-side extending part 91 in a planar view is bent, and surfaces of the projection part 34 and the second extending part 912 on the side opposed to the insertion hole 42 are flush with each other. This configuration differs from the case in which a step part projecting toward the side opposed to the insertion hole 42 is formed between the ends of the projection part 34 and the second extending part 912. Hence, the bolt 8 is prevented from hitting against the step part and rebounding in an unexpected direction. In addition, the above configuration differs from the case in which a step part recessed to the insertion hole 42 side is formed between the ends of the projection part 34 and the second extending part 912. Hence, the bolt 8 is prevented from entering the gap formed at the base part of the projection part 34, which is formed by the step part, and becoming difficult to retrieve.

In addition, the convex guides 33 are formed on the insulating parts 32 along the direction in which the high-voltage cables 6 are inserted. For example, assuming that the guides 33 are not formed, the gap between the end of the counter-hole-side extending part 92 and the terminal connecting part 31 (bus bar 5) becomes small due to the thickness of the bus bar 5. However, since the bus bar 5 is not arranged on the insulating part 32, the gap becomes larger by the thickness of the bus bar 5. Conversely, according to the above configuration, since the guide 33 is formed on the insulating part 32, the gap between the end of the counter-hole-side extending part 92 and the insulating parts 32, which is generated because the bus bar 5 is not arranged, can be filled. As a result, the bolt 8 can be prevented from falling to the side opposed to the insertion hole 42. In addition, since the guides 33 can restrict movement of the bolt 8 rolling on the mounting surface 3a of the terminal block 3, the bolt 8 can be easily retrieved.

In addition, the extending part 9 is formed so as to extend from the whole circumference of the opening part 7 toward the terminal block 3 side. Hence, since the extending part 9 surrounds the terminal block 3, the bolt 8 is reliably prevented from falling into the back of the case 4 from the terminal block 3.

As described above, according to the present embodiment, a power conversion apparatus can be provided which can prevent a bolt from falling into the back of a case while allowing a bolt fallen on a terminal block to be easily retrieved regardless of the size of an opening part.

(Second Embodiment)

Next, a second embodiment will be explained.

Figure 9:
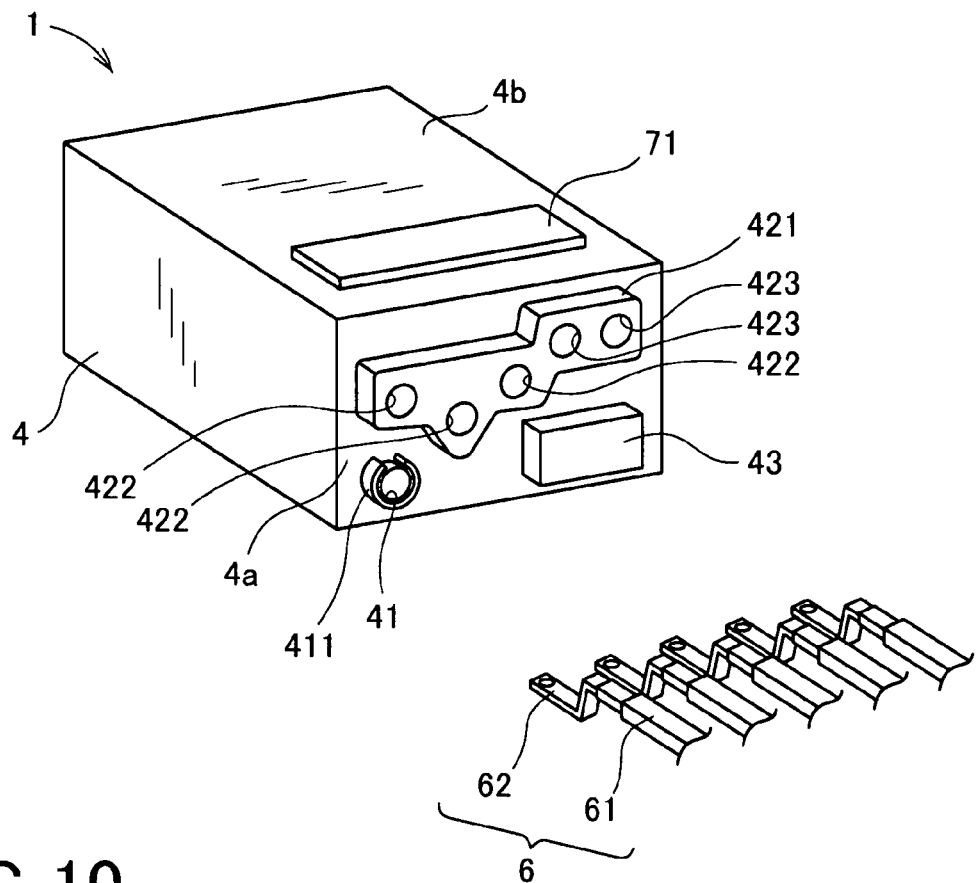
FIG. 9 is a perspective view showing a power conversion apparatus according to a second embodiment.
Figure 10:
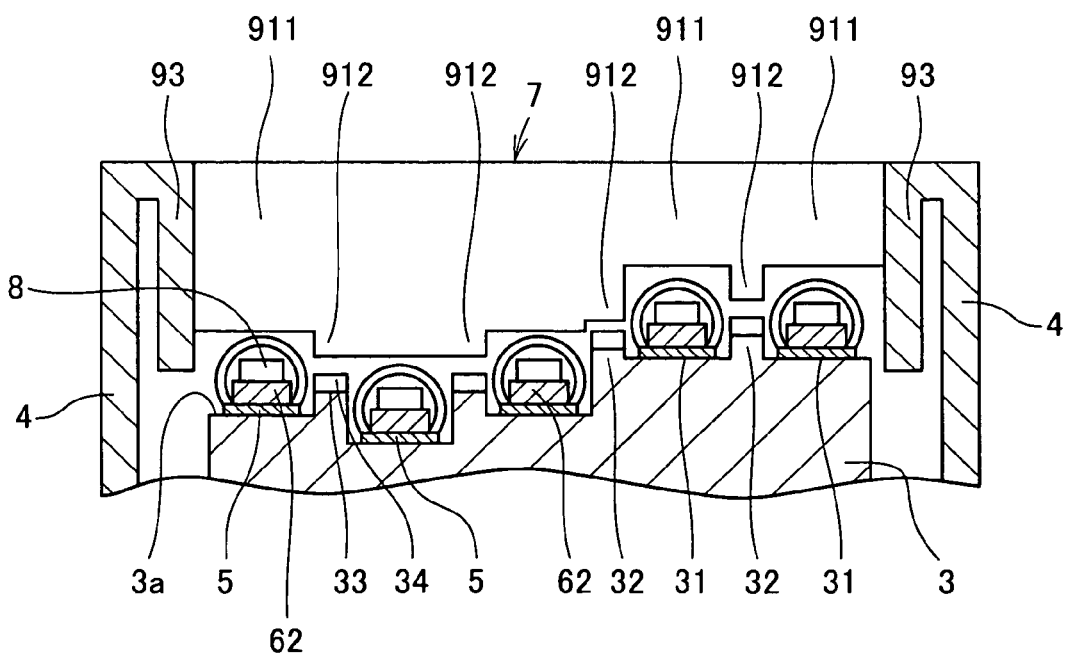
FIG. 10 is a sectional view cut along C-C line of FIG. 4 according to the second embodiment.

FIG. 9 is a perspective view showing a power conversion apparatus according to the second embodiment. FIG. 10 is a sectional view cut along C-C line of FIG. 4 according to the second embodiment. Note that, in FIG. 10, the apparatus is shown by being reversed in the horizontal direction for the sake of convenience.

In the second embodiment, the insertion holes 42 (422, 423) are asymmetrically formed in the side wall 4a of the case 4. In addition, the second embodiment differs from the first embodiment in that the terminal connecting parts 31 of the terminal block 3, on which the high-voltage cables 6 inserted into the insertion holes 42 (422, 423) are arranged, are asymmetrically formed so as to correspond to the insertion holes 42 (422, 423). Specifically, as shown in FIG. 9, the central insertion hole 422 for three phase, which is included in insertion holes 422 for three phase into which the high-voltage cables 6 for U-phase, V-phase, and W-phase of three-phase AC are inserted, is out of alignment in the direction opposed to the opening part 7. The three insertion holes 422 for three phase are asymmetrically formed so as to have a substantially V-shape. In addition, insertion holes 423 for a power source, into which P-phase and N-phase of a DC power source are inserted, are formed so as to be out of alignment in the direction to the opening part 7 with respect to the insertion holes 422 for three phase. As shown in FIG. 10, the terminal connecting parts 31 are formed so as to be out of alignment corresponding to the insertion holes 422 and the insertion holes 423 so that the terminal parts 62 of the high-voltage cables 6 inserted into the insertion holes 422 and the insertion holes 423, which are out of alignment, are arranged on the terminal connecting parts 31 of the terminal block 3 in a state where the terminal parts 62 are inserted. In addition, the first extending parts 911 are formed by varying the respective projection lengths of thereof so as to follow the opposed terminal block 3 so that the gap generated between each of the ends of the first extending parts 911 and the high-voltage cable 6 has a distance which prevents the bolt 8 from passing through the gap. In addition, the second extending parts 912 are also formed by varying the respective projection lengths thereof so as to follow the opposed terminal block 3 so that the gap generated between each of the ends of the second extending parts 912 and the projection part 34 has a distance which prevents the bolt 8 from passing through the gap.

Note that other configurations are similar to those of the first embodiment.

Next, advantages of the second embodiment will be explained.

According to the second embodiment, the insertion holes 42 (422, 423) are asymmetrically formed in the side wall 4a of the case 4. In addition, the terminal connecting parts 31 of the terminal block 3, on which the high-voltage cables 6 inserted into the insertion holes 42 (422, 423) are arranged, are asymmetrically formed so as to correspond to the insertion holes 42 (422, 423). Hence, compared with the configuration in which both the insertion holes 42 and the terminal connecting parts 31 are linearly formed, lengths of the arranged insertion holes 42 and the arranged terminal connecting parts 31 are not required to be ensured to ensure insulation distances between the insertion holes 42. Hence, compared with the configuration in which both the insertion holes 42 and the terminal connecting parts 31 are linearly formed, lengths of the arranged insertion holes 42 and the arranged terminal connecting parts 31 of the case 4 and the terminal block 3 can be decreased.

(Third Embodiment)

Next, a third embodiment will be explained.

Figure 11:
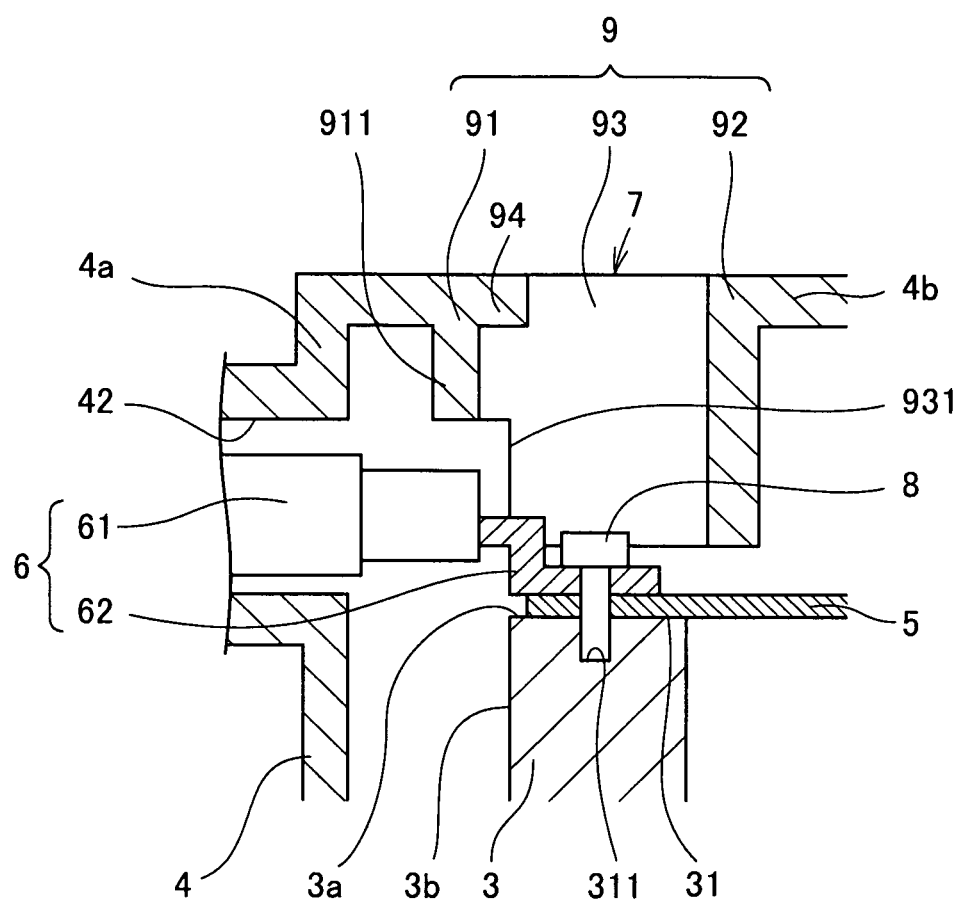
FIG. 11 is a sectional view cut along A-A line of FIG. 4 according to a third embodiment.

FIG. 11 is a sectional view cut along A-A line of FIG. 4 according to the third embodiment.

The third embodiment differs from the first embodiment in that a projection part 94 is formed so as to project from the side opposed to the terminal block 3 of the extending part 9 toward the inside of the opening part 7. Specifically, as shown in FIG. 11, the projection part 94 is formed so as to project from the end portion on the side opposed to the terminal block 3 of the hole-side extending part 91 toward the counter-hole-side extending part 92. That is, the projection part 94 is formed so as to project toward the inside of the opening part 7. In addition, the length of the formed projection part 94 is smaller than the diameter of the head of the bolt 8 and the length of the shaft of the bolt 8.

Note that other configurations are similar to those of the first embodiment.

Next, advantages of the third embodiment will be explained.

In the third embodiment, even if the bolt 8 accidentally falls when fixing the high-voltage cable 6 to the terminal connecting part 31 with the bolt 8, the bolt 8 can remain on the terminal block 3 due to the extending part 9 formed around the circumference of the opening part 7. Hence, even when the projection part 94 is formed so as to project from the side opposed to the terminal block 3 of the extending part 9 toward the inside of the opening part 7 so that the opening area of the opening part 7 becomes small, the bolt 8 can be easily retrieved through the opening part 7. Specifically, in the third embodiment, the length of the projection part 94 is smaller than the diameter of the head of the bolt 8 and the length of the shaft of the bolt 8. Hence, when seeing the inside of the case 4 through the opening part 7, the bolt 8 fallen on the terminal block 3 can be reliably identified. Hence, the opening area of the opening part 7 can be made small while the bolt 8 can be easily retrieved.

(Other Embodiments)

In the following embodiments, components identical with or similar to those of the embodiments described above are given the same numerals for the sake of omitting duplicated explanation.

Figure 12:
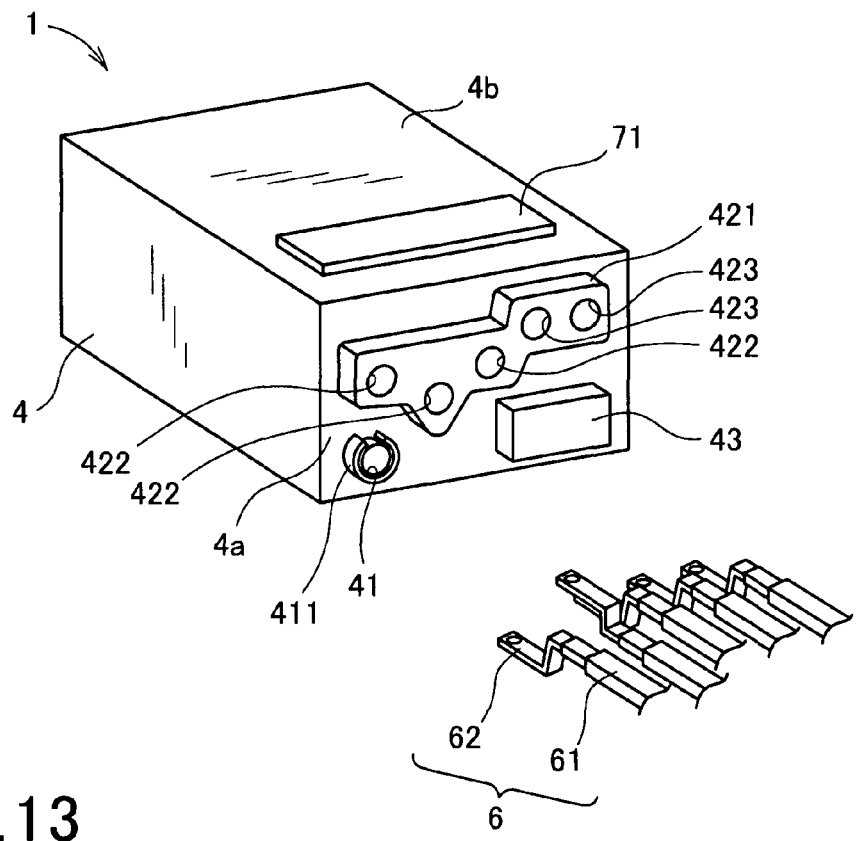
FIG. 12 is a perspective view showing a power conversion apparatus according to another embodiment.
Figure 13:
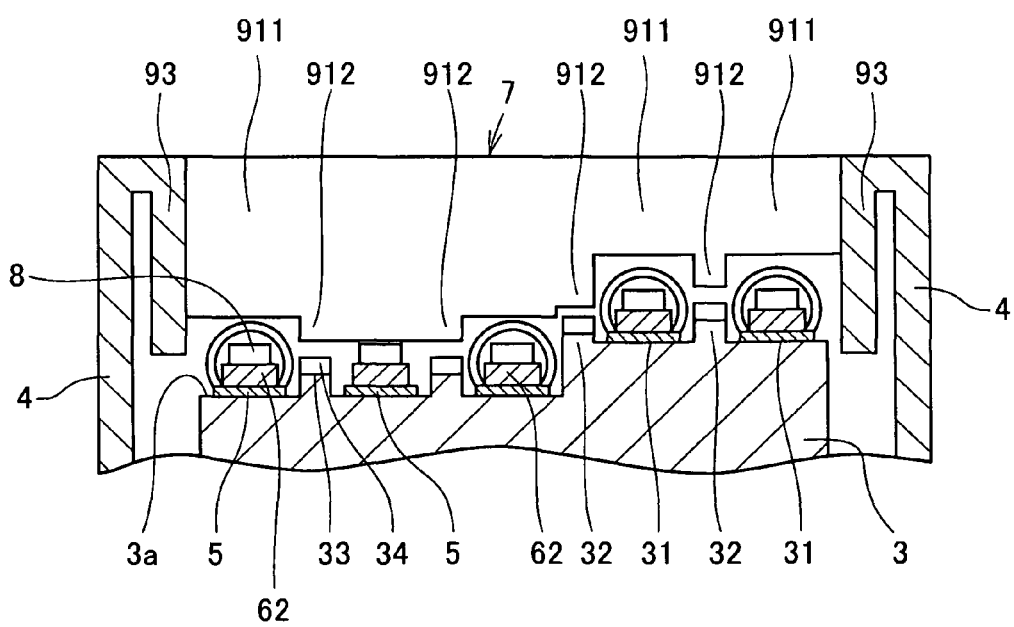
FIG. 13 is a sectional view cut along C-C line of FIG. 4 according to the another embodiment.

In the first embodiment, as shown in FIGS. 12 and 13, the orientation of the high-voltage cable 6 inserted into the central insertion hole 422 for three phase included in the central insertion holes 22 for three phase, which are out of alignment, may be reversed in the vertical direction with respect to the high-voltage cables 6 inserted into the other insertion holes 22 for three phase.

Figure 14:
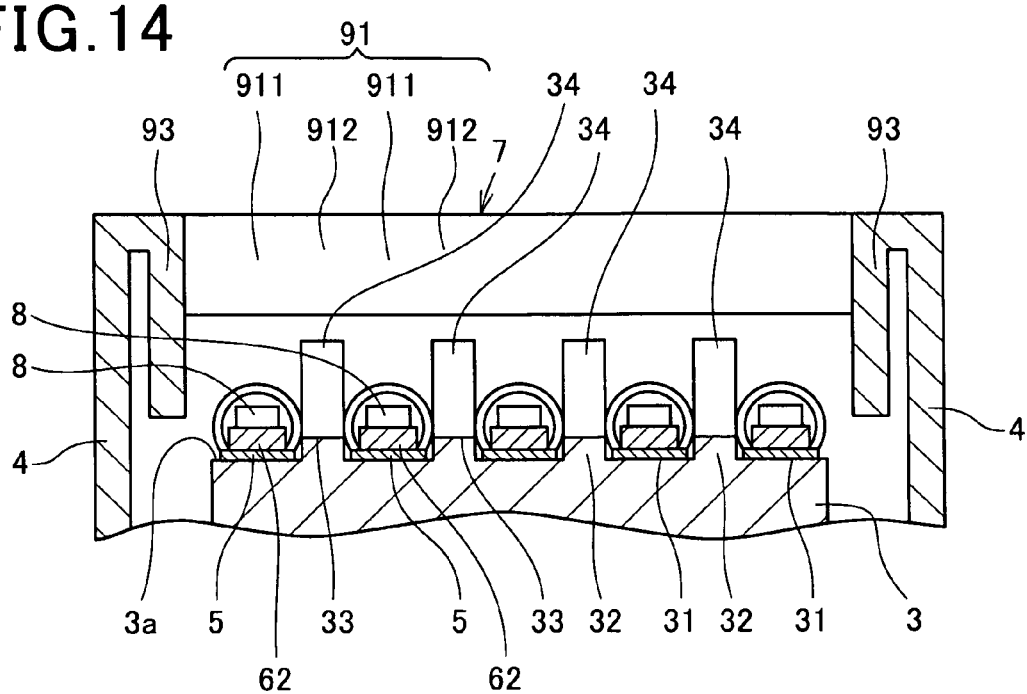
FIG. 14 is a sectional view cut along C-C line of FIG. 4 according to another embodiment.

In the first embodiment, the second extending part 912 is formed so as to extend further toward the terminal block 3 side than the first extending part 911 extends toward the terminal block 3 side. However, the hole-side extending part 91 may be formed so that the second extending part 912 and the first extending part 911 have the same length. In this case, as shown in FIG. 14, the projection parts 34 formed on the terminal block 3 are extended upward toward the hole-side extending part 91 side, thereby filling the gap between the terminal block 3 (insulating parts 32) and the hole-side extending part 91. Hence, the bolt 8 can be prevented from falling. In addition, since the projection parts 34 are extended upward instead of extending the second extending parts 912, the hole-side extending part 91 can be formed in a linear shape. Hence, compared with the case where the hole-side extending part 91 is formed so as to have a comb-like shape, die forming can be easily performed at the time of manufacturing. In addition, since the projection parts 34 formed integrally with the terminal block 3 are insulating resin, long insulation distances can be ensured between the end of the hole-side extending part 91 made of a conductor and the terminals 62 of the high-voltage cables 6.

In the first embodiment, the extending part 9 is configured with the hole-side extending part 91, the counter-hole-side extending part 92, and the intermediate extending parts 93, and is formed so as to extend from the whole circumference of the opening part. However, instead of forming the extending part 9 so as to extend from the whole circumference, an embodiment may be provided in which the extending part 9 is configured with only the hole-side extending part 91 and the counter-hole-side extending part 92.

In the first embodiment, the projection parts 34 are formed. However, the projection parts 34 may not be formed. In this case, by extending the first extending parts 911 toward the terminal block 3 side, the gaps between the insulating parts 32 and the ends of the first extending parts 911 can be filled.

In the first embodiment, the projection parts 34 having an L-shaped cross section are formed on the projecting portions of the terminal block 3. However, projection parts may be formed on an end portion which is formed by extending the whole terminal block 3 toward the insertion holes 42 side.

In the first embodiment, the guides 33 are formed on the insulating parts 32. However, the guides 33 may not be formed.

In the first embodiment, the projection parts 34 are formed so as to be opposed to the first extending parts 912 of the hole-side extending part 91. However, the projection parts 34 may be formed so as to be opposed to the counter-hole-side extending part 92 or the intermediate extending parts 93.

In the first embodiment, the opening part 7 is formed so as to have a rectangular shape. However, the opening part 7 may be formed so as to have an ellipse shape by inflecting the ends of a rectangle.

Figure 15:
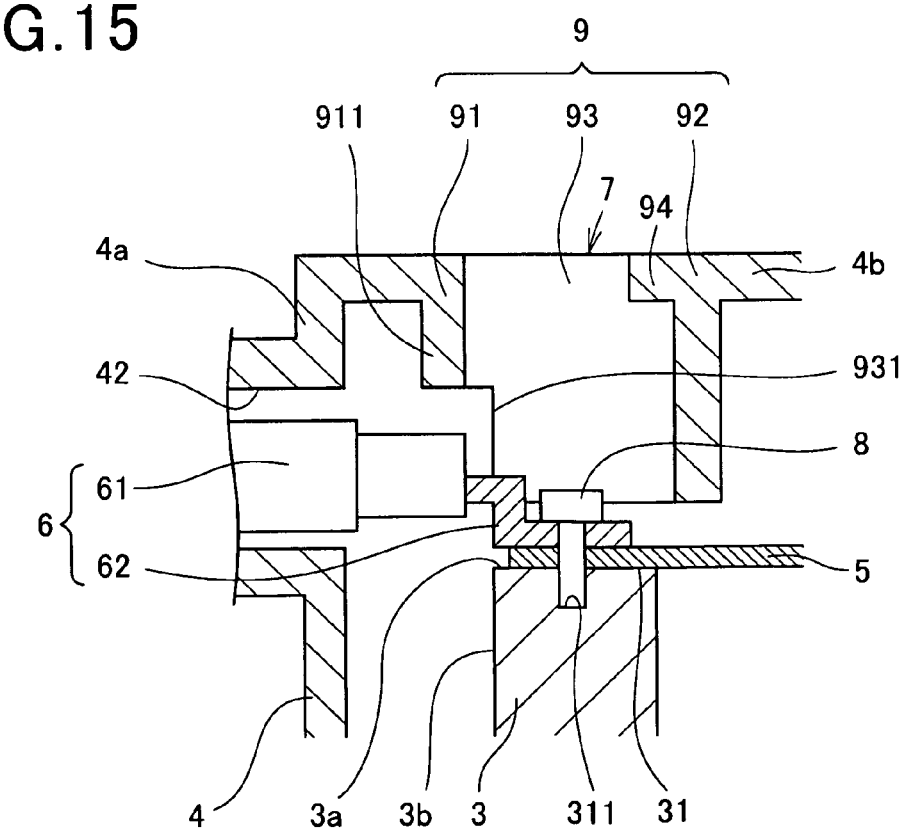
FIG. 15 is a sectional view cut along A-A line of FIG. 4 according to another embodiment.
Figure 16:
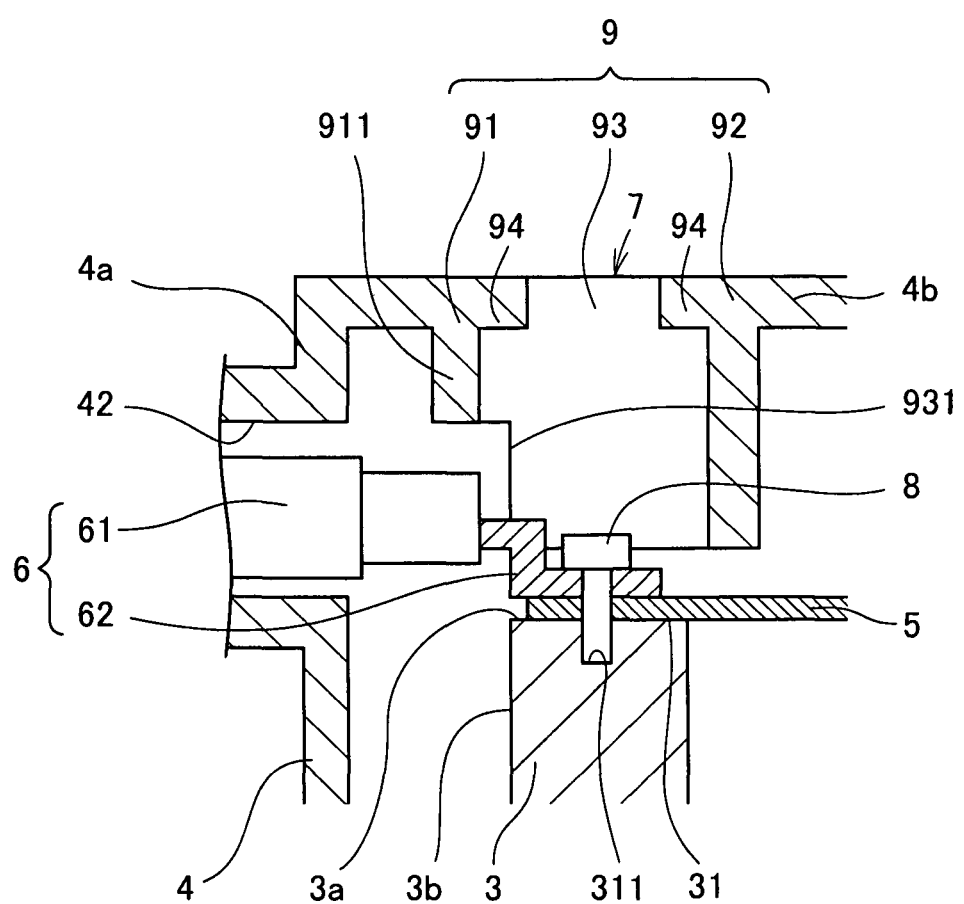
FIG. 16 is a sectional view cut along A-A line of FIG. 4 according to another embodiment.
Figure 17:
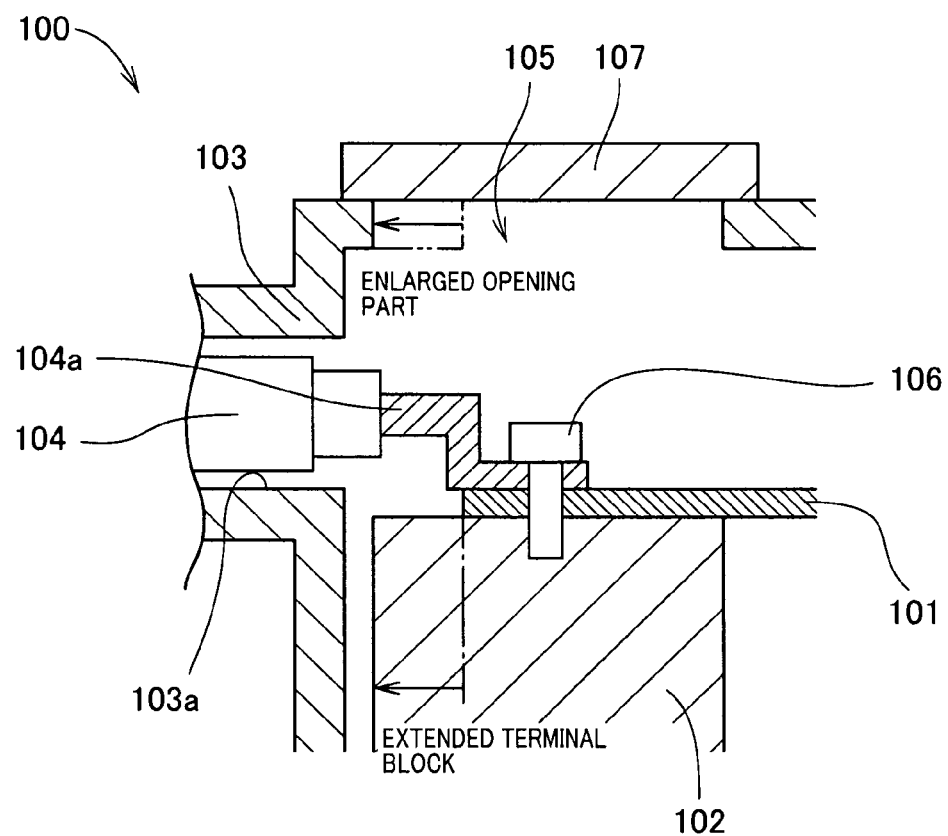
FIG. 17 is a sectional view showing a main part of a conventional power conversion apparatus

In the third embodiment, the projection part 94 is formed so as to project from the end portion opposed to the terminal block 3 side of the hole-side extending part 91 toward the counter-hole-side extending part 92. However, as shown FIG. 15, the projection part 94 may be formed so as to project from the end portion opposed to the terminal block 3 side of the counter-hole-side extending part 92 toward the hole-side extending part 91. In addition, as shown FIG. 16, two projection parts 94 may be formed. One of the projection parts 94 is formed so as to project from the end portion opposed to the terminal block 3 side of the hole-side extending part 91 toward the counter-hole-side extending part 92. The other of the projection parts 94 is formed so as to project from the end portion opposed to the terminal block 3 side of the counter-hole-side extending part 92 toward the hole-side extending part 91.

Hereinafter, aspects of the above-described embodiments will be summarized.

As an aspect of the embodiment, in a power conversion apparatus, which accommodates electronic components configuring at least part of a power conversion circuit, and a terminal block collecting wires running from the electronic components, in a case, the terminal block includes a plurality of terminal connecting parts at which a plurality of high-voltage cables, through which electric power is received from and provided to the outside of the case, and the wires are connected to each other, and insulating parts provided between the terminal connecting parts and ensuring insulation between the high-voltage cables and between the wires, a plurality of insertion holes, into which the high-voltage cables are inserted, are formed in one side wall of the case, an opening part for performing an operation for fixing the high-voltage cables to the terminal connecting parts is formed in a wall of the case opposed to the terminal connecting parts and the insulating parts, and an extending part is formed around the opening part so as to extend from a circumference of the opening part toward the terminal block side.

According to the above configuration, even if a bolt accidentally falls when fixing the high-voltage cable to the terminal connecting part with the bolt, the bolt is prevented from falling into the back of the case from the terminal block by the extending part extending from the opening part toward the terminal block side. In addition, since the bolt remains on the terminal block due to the extending part, the bolt can be easily retrieved through the opening part.

In the power conversion apparatus, the extending part includes a hole-side extending part on the insertion hole side and a counter-hole-side extending part on the side opposed to the insertion hole According to the above configuration, since both sides in the longitudinal direction of the terminal block can be covered with the hole-side extending part and the counter-hole-side extending part, the bolt can be prevented from falling into the back of the case.

In the power conversion apparatus, the hole-side extending part includes a first extending part opposed to the terminal connecting part and a second extending part opposed to the insulating part, and the second extending part is formed so as to extend further toward the terminal block side than the first extending part extends toward the terminal block side.

According to the above configuration, due to the insulating part, the gap between the terminal block and the hole-side extending part, which is generated because the high-voltage cable is not arranged, can be filled with the second extending part extending further than the first extending part extends. Hence, the bolt can be prevented from falling into the back of the case from the insulating part of the terminal block.

In the power conversion apparatus, the terminal block is formed with a projection part projecting from an end portion of the terminal block toward the extending part.

According to the above configuration, since the projection part projecting toward the extending part is formed, the length of the extending part extending from the opening part toward the terminal block side can be decreased.

In the power conversion apparatus, the projection part is formed so as to project from an end in the direction, in which the wire and the high-voltage cable extend, of the insulating part toward the extending part.

According to the above configuration, by filling the gap between the terminal block and the hole-side extending part, which is generated because the high-voltage cable is not arranged on the insulating part, with the projection part extending toward the hole-side extending part, the bolt can be prevented from falling through the gap between the terminal block and the hole-side extending part.

In the power conversion apparatus, the projection part and the extending part are formed so that surfaces on the side thereof opposed to the insertion hole are flush with each other.

The above configuration differs from the case in which a step part projecting toward the side opposed to the insertion hole is formed between the ends of the projection part and the extending part. Hence, the bolt is prevented from hitting against the step part and bounding in an unexpected direction. In addition, the above configuration differs from the case in which a step part recessed to the insertion hole side is formed between the ends of the projection part and the extending part. Hence, the bolt is prevented from entering the gap formed at the base part of the projection part, which is formed by the step part, and becoming difficult to retrieve.

In the power conversion apparatus, the insulating part is formed with a convex guide in the direction in which the high-voltage cable is inserted.

According to the above configuration, the gap between the end of the counter-hole-side extending part and the insulating part, which is generated because a bus bar is not provided, can be filled with the convex guide. As a result, the bolt is prevented from falling toward the side opposed to the insertion hole. In addition, since the guide can restrict movement of the bolt rolling on the terminal block, the bolt can be easily retrieved through the opening part.

In the power conversion apparatus, the extending part is formed so as to extend from the whole circumference of the opening part.

According to the above configuration, since the extending part surrounds the whole circumference of the terminal block, the bolt can be reliably prevented from falling into the back of the case from the terminal block.

In the power conversion apparatus, the length of the extending part projecting toward the terminal block side follows the opposed terminal block.

According to the above configuration, since the extending part is formed so that the length of the extending part projecting toward the terminal block side follows the opposed terminal block, the gap generated between the terminal block and the extending part can be made small. Hence, the bolt can be prevented from falling through the gap between the terminal block and the extending part.

In the power conversion apparatus, the insertion holes are asymmetrically formed in the one side wall of the case, and the terminal connecting parts of the terminal block, on which the high-voltage cables inserted into the insertion holes are arranged, are asymmetrically formed so as to correspond to the insertion holes.

Since the high-voltage cable is inserted into the insertion hole, a constant insulation distance is required to be ensured between the insertion hole. According to the above configuration, compared with the configuration in which both the insertion holes and the terminal connecting parts are linearly formed, lengths of the arranged insertion holes and the arranged terminal connecting parts are not required to be ensured to ensure insulation distances between the insertion holes. Hence, compared with the configuration in which both the insertion holes and the terminal connecting parts are linearly formed, lengths of the arranged insertion holes and the arranged terminal connecting parts of the case and the terminal block can be decreased.

In the power conversion apparatus, a projection part is formed so as to project from the side opposed to the terminal block of the extending part toward the inside of the opening part.

According to the above configuration, compared with the configuration in which a projection part is not formed so as to project toward the inside of the opening part, the opening area of the opening part can be made small.

It will be appreciated that the present invention is not limited to the configurations described above, but any and all modifications, variations or equivalents, which may occur to those who are skilled in the art, should be considered to fall within the scope of the present invention.

What is claimed is:

1. A power conversion apparatus comprising a case accommodating electronic components configuring at least part of a power conversion circuit, and a terminal block connecting wires running from the electronic components in the case,
    wherein the terminal block includes a plurality of terminal connecting parts connecting a plurality of high-voltage cables, through which electric power is received from and provided to the outside of the case, with the wires on the terminal block, and insulating parts of the terminal block provided between the terminal connecting parts and ensuring insulation between the high-voltage cables and between the wires,
    a plurality of insertion holes, into which the high-voltage cables are inserted, are formed in a projecting wall extending from one side wall of the case,
    an opening part for performing an operation fixing the high-voltage cables to the terminal connecting parts is formed in a top wall of the case opposed to the terminal connecting parts and the insulating parts,
    an extending part is formed around in the opening part so as to extend from a circumference of the opening part toward the terminal block side, and
    wherein the extending part includes a hole-side extending part on a side of the insertion holes and a counter-hole-side extending part on the side opposed to the insertion holes.

2. The power conversion apparatus according to claim 1, wherein
    the hole-side extending part includes a first extending part opposed to the terminal connecting part and a second extending part opposed to the insulating part, and the second extending part is formed so as to extend further toward the terminal block side than the first extending part extends toward the terminal block side.

3. The power conversion apparatus according to claim 1, wherein
    the terminal block is formed with a projection part projecting from an end portion of the terminal block toward the extending part.

4. The power conversion apparatus according to claim 3, wherein
    the projection part is formed so as to project from an end in the direction, in which the wire and the high-voltage cable extend, of the insulating part toward the extending part.

5. The power conversion apparatus according to claim 3, wherein
    the projection part and the extending part are formed so that surfaces on the side thereof opposed to the insertion hole are flush with each other.

6. The power conversion apparatus according to claim 1, wherein
the insulating part is formed with a convex guide in the direction in which the high-voltage cable is inserted.

7. The power conversion apparatus according to claim 1, wherein
the extending part is formed so as to extend from the whole circumference of the opening part.

* * * * *